(12) United States Patent
Chiang et al.

(10) Patent No.: US 10,629,667 B2
(45) Date of Patent: Apr. 21, 2020

(54) LIGHT-EMITTING DEVICE COMPRISING FIRST LIGHT-SHIELDING LAYER HAVING FIRST OPENING AND SECOND LIGHT-SHIELDING LAYER HAVING SECOND OPENING CORRESPONDING TO THE FIRST OPENING

(71) Applicant: Au Optronics Corporation, Hsinchu (TW)

(72) Inventors: Chi-Sheng Chiang, Hsinchu (TW); Chun-Hsiang Chan, Hsinchu (TW); Hsin-Hung Li, Hsinchu (TW); To-Cheng Fan, Hsinchu (TW); Ting-Wei Tsai, Hsinchu (TW); Min-Chin Tsai, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/049,813

(22) Filed: Jul. 31, 2018

(65) Prior Publication Data
US 2019/0319084 A1 Oct. 17, 2019

(30) Foreign Application Priority Data
Apr. 11, 2018 (TW) .............................. 107112374 A

(51) Int. Cl.
| H01L 27/32 | (2006.01) |
| H01L 27/15 | (2006.01) |
| H01L 29/423 | (2006.01) |
| H01L 33/06 | (2010.01) |
| H01L 33/42 | (2010.01) |

(Continued)

(52) U.S. Cl.
CPC ........ *H01L 27/3272* (2013.01); *H01L 27/156* (2013.01); *H01L 27/322* (2013.01);
(Continued)

(58) Field of Classification Search
CPC combination set(s) only.
See application file for complete search history.

(56) References Cited

U.S. PATENT DOCUMENTS

| 6,344,662 B1 | 2/2002 | Dimitrakopoulos et al. |
| 6,344,712 B1 | 2/2002 | Eida et al. |

(Continued)

FOREIGN PATENT DOCUMENTS

| CN | 105093668 | 11/2015 |
| CN | 104617104 | 6/2017 |

(Continued)

*Primary Examiner* — Nduka E Ojeh
(74) *Attorney, Agent, or Firm* — JCIPRNET

(57) ABSTRACT

A light-emitting device includes a substrate, an active device, a first light-shielding layer, a transparent electrode, a second light-shielding layer, a light-converting layer, an electroluminescent structure, and a top electrode. The active device is located on the substrate. The first light-shielding layer is disposed on the active device and has a first opening. The transparent electrode is located on the first light-shielding layer and electrically connected to the active device. The second light-shielding layer is located on the transparent electrode and has a second opening corresponding to the first opening. The light-converting layer is substantially located in the first opening. The electroluminescent structure is substantially located in the second opening. The transparent electrode is located between the first opening and the second opening. The electroluminescent structure is located between the top electrode and the transparent electrode.

19 Claims, 3 Drawing Sheets

(51) Int. Cl.
*H01L 33/44* (2010.01)
*H01L 33/50* (2010.01)
*H01L 33/52* (2010.01)
*H01L 51/50* (2006.01)
*H01L 51/52* (2006.01)
*H01L 27/12* (2006.01)
*H01L 33/40* (2010.01)

(52) U.S. Cl.
CPC ...... *H01L 27/3258* (2013.01); *H01L 27/3262* (2013.01); *H01L 29/42368* (2013.01); *H01L 33/06* (2013.01); *H01L 33/42* (2013.01); *H01L 33/44* (2013.01); *H01L 33/502* (2013.01); *H01L 33/52* (2013.01); *H01L 51/5012* (2013.01); *H01L 51/5206* (2013.01); *H01L 51/5253* (2013.01); *H01L 27/124* (2013.01); *H01L 27/1248* (2013.01); *H01L 27/3248* (2013.01); *H01L 27/3276* (2013.01); *H01L 33/405* (2013.01); *H01L 51/502* (2013.01); *H01L 51/5221* (2013.01); *H01L 2251/308* (2013.01); *H01L 2251/5369* (2013.01); *H01L 2251/558* (2013.01)

(56) References Cited

U.S. PATENT DOCUMENTS

| | | | |
|---|---|---|---|
| 6,426,536 | B1 | 7/2002 | Misewich et al. |
| 10,062,859 | B2 | 8/2018 | Chou et al. |
| 2004/0125265 | A1* | 7/2004 | Koo ................. C30B 1/023 349/56 |
| 2005/0285509 | A1 | 12/2005 | Funamoto et al. |
| 2017/0153368 | A1* | 6/2017 | Yoon ................. G02F 1/133512 |
| 2018/0013086 | A1 | 1/2018 | Chou et al. |
| 2018/0031905 | A1 | 2/2018 | Chen et al. |
| 2018/0061927 | A1* | 3/2018 | Jeong ................ H01L 29/78648 |
| 2018/0182815 | A1* | 6/2018 | Choi ..................... H01L 27/322 |
| 2018/0182977 | A1* | 6/2018 | Hirose .................. H01L 51/502 |
| 2019/0041701 | A1* | 2/2019 | Chen .................... H01L 25/0753 |
| 2019/0163016 | A1* | 5/2019 | Kim ..................... G02F 1/133603 |
| 2019/0189966 | A1* | 6/2019 | Jang .................... H01L 51/5268 |

FOREIGN PATENT DOCUMENTS

| | | |
|---|---|---|
| CN | 105140368 | 11/2017 |
| TW | 201803103 | 1/2018 |

* cited by examiner

LIGHT-EMITTING DEVICE COMPRISING FIRST LIGHT-SHIELDING LAYER HAVING FIRST OPENING AND SECOND LIGHT-SHIELDING LAYER HAVING SECOND OPENING CORRESPONDING TO THE FIRST OPENING

CROSS-REFERENCE TO RELATED APPLICATION

This application claims the priority benefit of Taiwan application serial no. 107112374, filed on Apr. 11, 2018. The entirety of the above-mentioned patent application is hereby incorporated by reference herein and made a part of this specification.

BACKGROUND OF THE INVENTION

Field of the Invention

The invention relates to a light-emitting device, and more particularly, to a light-emitting device having a light-shielding layer.

Description of Related Art

A light-emitting device (such as a display panel) generally includes an array substrate having light-emitting structures (such as light-emitting diodes) and a color filter substrate opposite to the array substrate. Since light rays emitted by the light-emitting structures in a display panel are spherical light, interference readily occurs between adjacent light-emitting structures, thus causing the issues of light leakage and light mixing. To alleviate the issues of light leakage and light mixing, the thickness of a black matrix (BM) disposed on a color filter substrate is generally increased to reduce the interference between the light-emitting structures. However, the overall thickness of the display panel is increased as a result. Therefore, a solution for alleviating the above issues is urgently needed.

SUMMARY OF THE INVENTION

The invention provides a light-emitting device that can alleviate the issues of light leakage and light mixing.

At least one embodiment of the invention provides a light-emitting device including a substrate, an active device, a first light-shielding layer, a transparent electrode, a second light-shielding layer, a light-converting layer, an electroluminescent structure, and a top electrode. The active device is located on the substrate. The first light-shielding layer is disposed on the active device and has a first opening. The transparent electrode is located on the first light-shielding layer and electrically connected to the active device. The second light-shielding layer is located on the transparent electrode and has a second opening corresponding to the first opening. The light-converting layer is substantially located in the first opening. The electroluminescent structure is substantially located in the second opening. The transparent electrode is located between the first opening and the second opening. The electroluminescent structure is located between the top electrode and the transparent electrode.

At least one embodiment of the invention provides a light-emitting device including a substrate, an active device, a first light-shielding layer, a transparent electrode, a second light-shielding layer, a light-converting layer, an electroluminescent structure, and a top electrode. The active device is located on the substrate. The first light-shielding layer is disposed on the active device and has a first opening. The depth of the first opening is about 4 microns to 10 microns. The transparent electrode is located on the first light-shielding layer and electrically connected to the active device. The second light-shielding layer is located on the transparent electrode and has a second opening corresponding to the first opening. The depth of the second opening is about 0.5 microns to 2 microns. The relationship between a width W11 of the first opening facing the transparent electrode and a width W21 of the second opening facing the transparent electrode is 80%≤W21/W11≤130%. The light-converting layer is substantially located in the first opening. The electroluminescent structure is substantially located in the second opening. The transparent electrode is located between the first opening and the second opening and is in contact with the light-converting layer and the electroluminescent structure. The electroluminescent structure is located between the top electrode and the transparent electrode.

An object of the invention is to alleviate the light leakage issue of the light-emitting device.

An object of the invention is to alleviate the light mixing issue of the light-emitting device.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
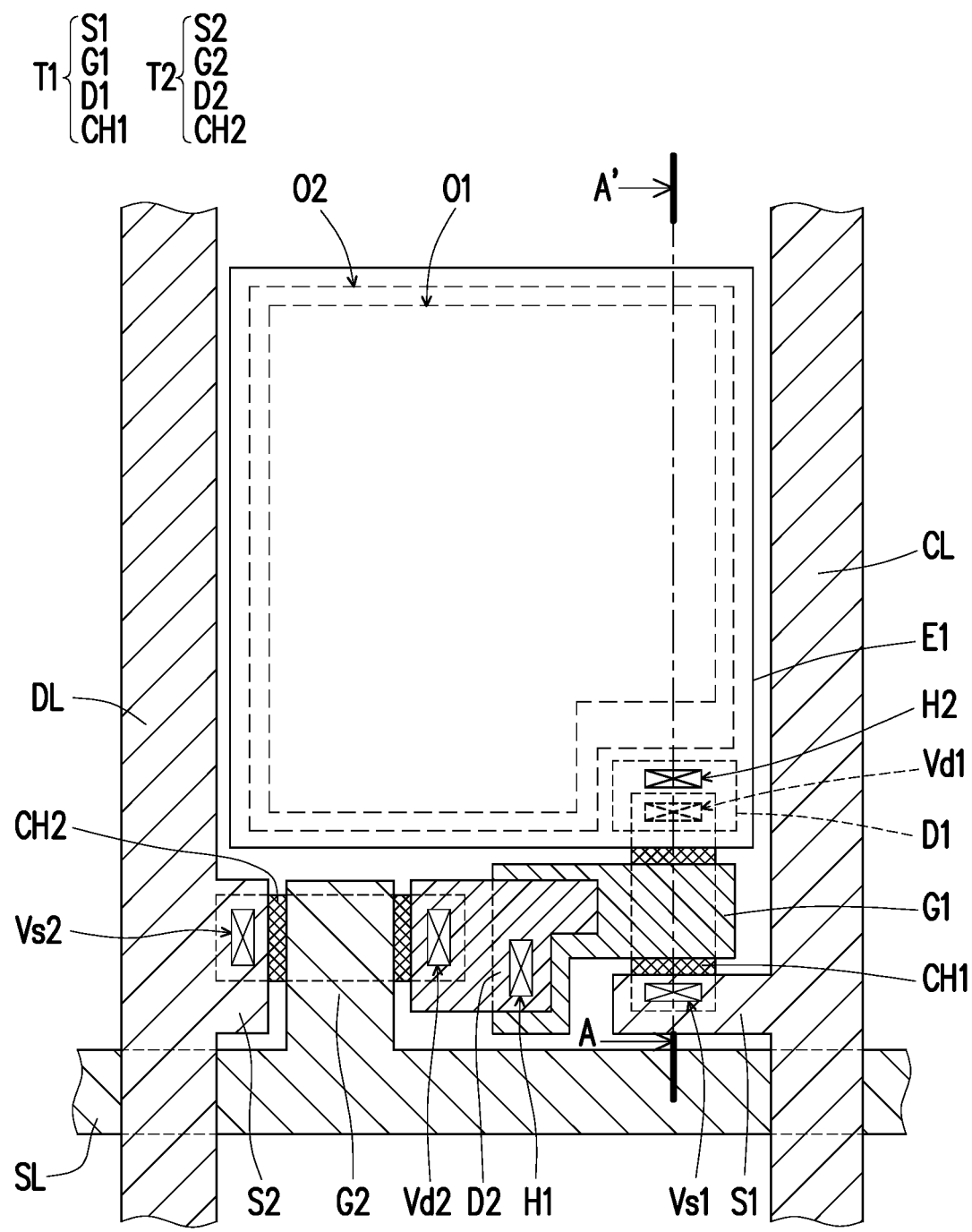
FIG. 1A is a top view of a light-emitting device according to an embodiment of the invention.
Figure 1B:
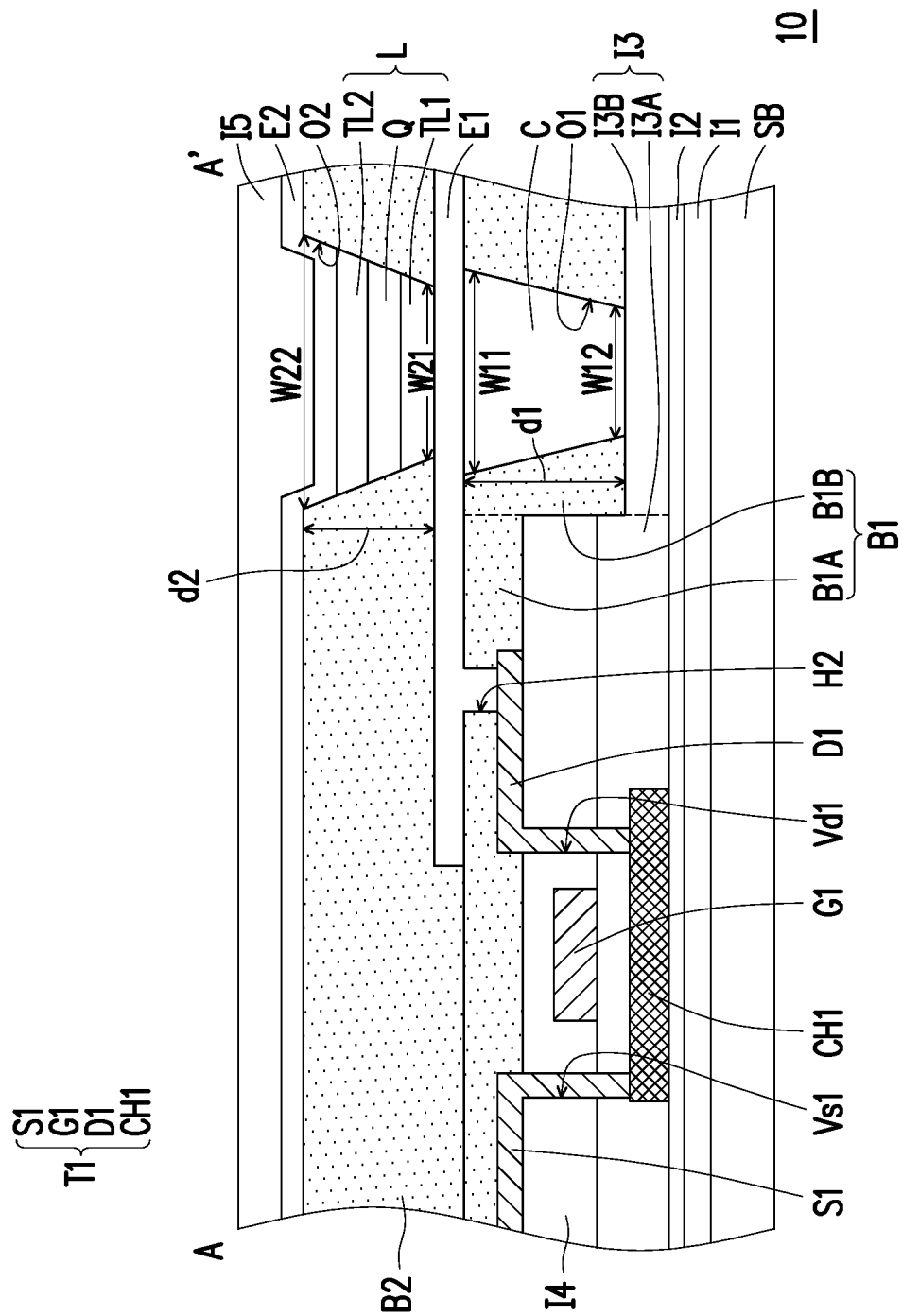
FIG. 1B is a cross section along section line AA' in FIG. 1A.

FIG. 1A is a top view of a light-emitting device according to an embodiment of the invention. For convenience, some components in the light-emitting device are omitted in FIG. 1A. FIG. 1B is a cross section along section line AA' in FIG. 1A.

Referring to FIG. 1A and FIG. 1B, a light-emitting device 10 includes a substrate SB, an active device T1, a first light-shielding layer B1, a transparent electrode E1, a second light-shielding layer B2, a light-converting layer C, an electroluminescent structure L, and a top electrode E2. In some embodiments, the light-emitting device 10 further includes an active device T2, a scan line SL, a data line DL, a signal line CL, an insulating layer I1, an insulating layer I2, an insulating layer I3, an insulating layer I4, and an insulating layer I5.

The scan line SL is intersected with the data line DL and the signal line CL. In the present embodiment, the extending direction of the scan line SL and the extending direction of the data line DL are not parallel as an example. The scan line SL and the data line DL generally adopt a metal material, but the invention is not limited thereto. In other embodiments, the scan line SL and the data line DL can adopt other conductive materials (such as the nitride of a metal material, the oxide of a metal material, the oxynitride of a metal material, or other suitable materials), or stacked layers of a metal material and other materials. In the present embodiment, the data line DL and the signal line CL can be formed by the same patterning process, but the invention is not limited thereto.

The active device T1 and the active device T2 are located on the substrate SB. In some embodiments, the insulating layer I1 and the insulating layer I2 are further disposed between the active device T1 and the substrate SB and between the active device T2 and the substrate SB, but the invention is not limited thereto.

The active device T1 has a source S1, a drain D1, a gate G1, and a channel layer CH1. The channel layer CH1 is located on the substrate SB. The gate G1 is overlapped with the channel layer CH1, and the insulating layer I3 is, for instance, a gate insulating layer and is located between the gate G1 and the channel layer CH1.

The insulating layer I4 covers the gate G1 and the insulating layer I3, and the insulating layer I4 is, for instance, an interlayer and is located between the source S1 and the gate G1 and between the drain D1 and the gate G1. The drain D1 and the source S1 are located on the insulating layer I4. A through-hole Vd1 is located in the insulating layer I3 and the insulating layer I4, and a through-hole Vs1 is located in the insulating layer I3 and the insulating layer I4. The drain D1 is electrically connected to the channel layer CH1 via the through-hole Vd1, and the source S1 is electrically connected to the channel layer CH1 via the through-hole Vs1. The drain D1 is electrically connected to the electroluminescent structure L. In the present embodiment, the gate G1 of the active device T1 is electrically connected to the active device T2, and the source S1 of the active device T1 is electrically connected to the signal line CL, but the invention is not limited thereto. In other embodiments, the gate G1 of the active device T1 is electrically connected to the scan line SL, and the source S1 of the active device T1 is electrically connected to the data line DL. In the present embodiment, the active device T1 is exemplified by a top-gate thin-film transistor, but the invention is not limited thereto. In other embodiments, the active device T1 can be a bottom-gate thin-film transistor.

The active device T2 has a source S2, a drain D2, a gate G2, and a channel layer CH2. The channel layer CH2 is located on the substrate SB. The gate G2 is overlapped with the channel layer CH2, an insulating layer (such as the insulating layer I3) is disposed between the gate G2 and the channel layer CH2, and the insulating layer I3 is, for instance, located between the gate G2 and the channel layer CH2.

An insulating layer (such as the insulating layer I4) covers the gate G2 and the insulating layer I3, and the insulating layer I4 is, for instance, located between the source S2 and the gate G2 and between the drain D2 and the gate G2. The drain D2 and the source S2 are located on the insulating layer I4, the through-hole Vd2 is located in the insulating layer I3 and the insulating layer I4, and the through-hole Vs2 is located in the insulating layer I3 and the insulating layer I4. The drain D2 is electrically connected to the channel layer CH2 via the through-hole Vd2, and the source S2 is electrically connected to the channel layer CH2 via the through-hole Vs2. In the present embodiment, the active device T2 is exemplified by a top-gate thin-film transistor, but the invention is not limited thereto. According to other embodiments, the active device T2 can be a bottom-gate thin-film transistor.

In the present embodiment, the drain D2 of the active device T2 is electrically connected to the gate G1 of the active device T1. For instance, the drain D2 of the active device T2 is electrically connected to the gate G1 of the active device T1 via a contact hole H1, and the contact hole H1 is located in the insulating layer I4. The gate G2 is electrically connected to the scan line SL, and the source S2 is electrically connected to the data line DL. In the present embodiment, the light-emitting device 10 is exemplified by containing two active devices, but the invention is not limited thereto. In other embodiments, the light-emitting device can contain one or three or more active devices.

The first light-shielding layer B1 is disposed on the active device T1 and has a first opening O1. The first opening O1 may penetrate through the first light-shielding layer B1. A depth d1 of the first opening O1 is about 4 microns to 10 microns. In some embodiments, the depth d1 of the first opening O1 can be less than the thickness of the first light-shielding layer B1. In some embodiments, the material of the first light-shielding layer B1 includes a photoresist, and the first opening O1 can be formed via a lithography process, but the invention is not limited thereto. In other embodiments, the first light-shielding layer B1 can be other light-shielding materials.

In the present embodiment, the first light-shielding layer B1 includes a first portion B1A and a second portion B1B. The first portion B1A substantially covers the active device T1. The second portion B1B is connected to the first portion B1A. The second portion B1B penetrates through the insulating layer I4 (such as an interlayer), and the first opening O1 penetrates through the second portion B1B. By the design that the second portion B1B penetrates through the insulating layer I4, the depth d1 of the first opening O1 can be greater. In some embodiments, the insulating layer I3 (such as a gate insulating layer) includes a thick portion I3A and a thin portion I3B. The thick portion I3A is overlapped with the gate G1. The thin portion I3B is overlapped with the first opening O1 and the second opening O2. The thickness of the thin portion I3B is about 0% to 50% that of the thick portion I3A. As a result, the depth d1 of the first opening O1 can be further increased. When the thickness of the thin portion I3B is 0% of the thickness of the thick portion I3A, the thin portion I3B is omitted.

In some embodiments, the second portion B1B can further penetrate through at least one of the insulating layer I3, the insulating layer I2, and the insulating layer I1, but the invention is not limited thereto.

The light-converting layer C is substantially located in the first opening O1. In a preferred embodiment, the light-converting layer C is completely located inside the first opening O1. The material of the light-converting layer C includes, for instance, a quantum dot material, the quantum dot material preferably includes, for instance, a perovskite material, cadmium selenide, or indium phosphide, and the light-converting layer C can be configured to convert the wavelength of light. In other embodiments, the material of the light-converting layer C includes, for instance, a filter material such as a fluorescent material.

The transparent electrode E1 is located on the first light-shielding layer B1 and electrically connected to the drain D1 of the active device T1 via a contact hole H2 in the first light-shielding layer B1. The material of the transparent electrode E1 includes, for instance, metal oxide such as indium tin oxide or indium zinc oxide. In some embodiments, the material of the transparent electrode E1 contains indium tin oxide and a thickness thereof is 50 nm to 139 nm.

The second light-shielding layer B2 is located on the transparent electrode E1 and has a second opening O2 corresponding to the first opening O1, and the first opening O1 is overlapped with the second opening O2. In some embodiments, the material of the second light-shielding layer B2 includes a photoresist, and the second opening O2 can be formed via a lithography process, but the invention is not limited thereto. In other embodiments, the second light-shielding layer B2 can be other light-shielding materials. A depth d2 of the second opening O2 is about 0.5 microns to 2 microns. The transparent electrode E1 is located between the first opening O1 and the second opening O2.

The electroluminescent structure L is substantially located in the second opening O2. In a preferred embodiment, the electroluminescent structure L is completely located inside the second opening O2. The transparent electrode E1 can be in contact with the electroluminescent structure L and the light-converting layer C. The electroluminescent structure L includes, for instance, a transport layer TL1, a transport layer TL2, and a light-emitting layer Q. One of the transport layer TL1 and the transport layer TL2 is an electron transport layer, and the other one is a hole transport layer. The light-emitting layer Q is located between the transport layer TL1 and the transport layer TL2. The material of the transport layer TL1 includes, for instance, nickel oxide, poly(3,4-ethylenedioxythiophene) polystyrene sulfonate (PEDOT:PSS), other materials, or a combination of the above materials, but the invention is not limited thereto. The material of the transport layer TL2 includes, for instance, zinc oxide, 1,3,5-tris(1-phenyl-1H-benzimidazol-2-yl)benzene (TBPI), other materials, or a combination of the above materials, but the invention is not limited thereto. The light-emitting layer Q includes, for instance, an organic light-emitting material or a quantum dot material, and the quantum dot material preferably includes a perovskite material. In the present embodiment, the electroluminescent structure L is configured to emit blue light, but the invention is not limited thereto. In other embodiments, the electroluminescent structure L can also be configured to emit light of other colors or white light. When the material of the light-emitting layer Q is a perovskite material and when the material of the transparent electrode E1 is indium tin oxide and the thickness thereof is 50 nm to 139 nm, light generated by the light-emitting layer Q can be effectively provided to the light-converting layer C to more efficiently generate colored light.

In the present embodiment, a width W11 of the top portion of the first opening O1 of the first light-shielding layer B1 is different from a width W12 of the bottom portion thereof, and a width W22 of the top portion of the second opening O2 of the second light-shielding layer B2 is different from a width W21 of the bottom portion thereof. For instance, the width W12 of the first opening O1 facing the substrate SB is less than the width W11 of the first opening O1 facing the transparent electrode E1, and the width W22 of the second opening O2 away from the transparent electrode E1 is greater than the width W21 of the second opening O2 facing the transparent electrode E1. The relationship between the width W11 of the first opening O1 facing the transparent electrode E1 and the width W21 of the second opening O2 facing the transparent electrode E1 is, for instance, preferably 80%≤W21/W11≤130%, and more preferably W21 is equal to W11. As a result, the issue of light leakage and light mixing of the light-emitting device 10 can be alleviated. It should be mentioned that, the width W11, the width W12, the width W21, and the width W22 in FIG. 1B are only exemplary, and the width refer to, for instance, observed from top to bottom of the light-emitting device 20 (such as the top view of the light-emitting device 20), the opening's maximum width along a horizontal plane.

The top electrode E2 is located on the second light-shielding layer B2. In the present embodiment, a portion of the top electrode E2 is filled in the second opening O2 and in contact with the electroluminescent structure L, but the invention is not limited thereto. In other embodiments, the electroluminescent structure L can completely fill the second opening O2, and therefore the top electrode E2 is not filled in the second opening O2. In other embodiments, the electroluminescent structure L can completely fill the second opening and cover a portion of the upper surface of the second light-shielding layer B2, and therefore the top electrode E2 is not filled in the second opening O2. The electroluminescent structure L is located between the top electrode E2 and the transparent electrode E1. In some embodiments, the material of the top electrode E2 includes lithium fluoride, aluminum, magnesium, silver, other materials, or a combination of the above materials, but the invention is not limited thereto. In some embodiments, the top electrode E2 can further be used as a reflective layer to reflect light rays emitted by the electroluminescent structure L. When the material of the top electrode E2 contains a metal material such as aluminum or silver or other alloy materials, and the thickness thereof is greater than 50 nm, a portion of light generated by the light-emitting layer Q can be reflected by the top electrode E2 and therefore effectively provided to the light-converting layer C to more efficiently generate colored light.

The insulating layer I5 covers the top electrode E2. The insulating layer I5 is, for instance, a packaging material.

Figure 2:
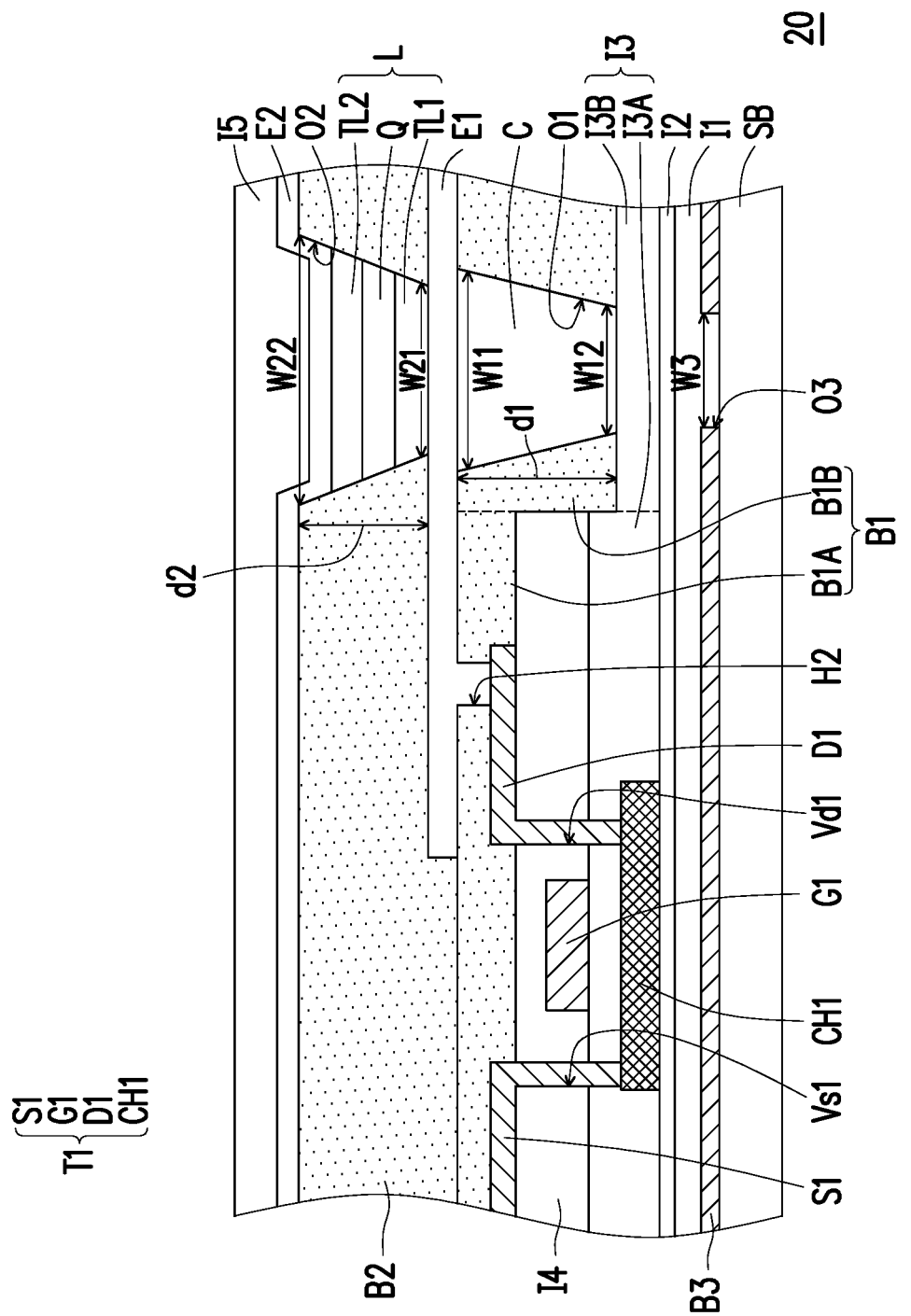
FIG. 2 is a cross section of a light-emitting device according to an embodiment of the invention.

FIG. 2 is a cross section of a light-emitting device according to an embodiment of the invention. It should be mentioned here that, the embodiment of FIG. 2 adopts the reference numerals of the embodiment of FIG. 1A and FIG. 1B and a portion of the contents thereof, wherein the same or similar numerals are used to represent the same or similar devices and descriptions of the same technical contents are omitted. The omitted portions are as described in the above embodiments and are not repeated herein.

The main difference between a light-emitting device 20 of FIG. 2 and the light-emitting device 10 is that the light-emitting device 20 further includes a third light-shielding layer B3.

The third light-shielding layer B3 is located between the active device T1 and the substrate SB and has a third opening O3 corresponding to the first opening O1. The width W12 of the first opening O1 facing the substrate SB is less than the width W3 of the third opening O3.

In some preferred embodiments, the material of the third light-shielding layer B3 contains a metal material such as aluminum or silver or other alloy materials, and the thickness thereof is greater than 50 nm. The third light-shielding layer B3 can prevent the issue of light leakage or light mixing due to large-angle scattering by blocking spherical light emitted by the light-converting layer C. In some preferred embodiments, the third light-shielding layer B3 can be used as an electrostatic discharge protection to increase the process yield of the light-emitting device 20.

In the embodiments above, by controlling the transparent electrode E1 and the top electrode E2, the light emitted by each of the light-emitting layers Q can be emitted toward the corresponding light-converting layer C to produce various different colored lights to generate a color screen, and the issue of light leakage of the light-emitting device and the issue of light mixing of the light-emitting device can be alleviated.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A light-emitting device, comprising:
   a substrate;
   an active device located on the substrate;
   a first light-shielding layer located on the active device and having a first opening;
   a transparent electrode located on the first light-shielding layer and electrically connected to the active device;
   a second light-shielding layer located on the transparent electrode and having a second opening corresponding to the first opening;
   a third light-shielding layer located between the active device and the substrate and having a third opening corresponding to the first opening, wherein a width of the first opening facing the substrate is less than a width of the third opening;
   a light-converting layer substantially located in the first opening;
   an electroluminescent structure substantially located in the second opening, wherein the transparent electrode is located between the first opening and the second opening; and
   a top electrode, wherein the electroluminescent structure is located between the top electrode and the transparent electrode.

2. The light-emitting device of claim 1, wherein a width of the first opening facing the transparent electrode is greater than a width of the second opening facing the transparent electrode.

3. The light-emitting device of claim 1, wherein a material of each of the third light-shielding layer and the top electrode comprises aluminum and wherein the third light-shielding layer has a thickness greater than 50 nm.

4. The light-emitting device of claim 1, wherein at least a portion of the top electrode is located in the second opening, the electroluminescent structure is completely located inside the second opening, and the light-converting layer is completely located inside the first opening.

5. The light-emitting device of claim 1, wherein a width of the first opening facing the substrate is less than a width of the first opening facing the transparent electrode.

6. The light-emitting device of claim 1, wherein the active device comprises:
   a channel layer;
   a gate located on the channel layer;
   a gate insulating layer located between the gate and the channel layer;
   a source and a drain respectively electrically connected to the channel layer; and
   an interlayer located on the gate, the gate insulating layer and the channel layer, wherein the first light-shielding layer comprises:
   a first portion substantially covering the active device; and
   a second portion connected to the first portion, wherein the second portion penetrates through the interlayer, and the first opening penetrates through the second portion.

7. The light-emitting device of claim 6, wherein the gate insulating layer comprises: a thick portion overlapped with the gate; and a thin portion overlapped with the first opening and the second opening, wherein a thickness of the thin portion is about 0% to 50% of the thick portion.

8. The light-emitting device of claim 1, wherein the transparent electrode is in contact with the electroluminescent structure and the light-converting layer, and a material of the transparent electrode comprises indium tin oxide and a thickness thereof is 50 nm to 139 nm.

9. The light-emitting device of claim 1, wherein a material of the light-converting layer comprises a quantum dot material.

10. The light-emitting device of claim 9, wherein the quantum dot material comprises a perovskite material.

11. The light-emitting device of claim 1, wherein a material of each of the first light-shielding layer and the second light-shielding layer comprises a photoresist.

12. The light-emitting device of claim 1, wherein a material of the electroluminescent structure comprises an organic light-emitting material or a quantum dot material.

13. The light-emitting device of claim 12, wherein the quantum dot material comprises a perovskite material.

14. The light-emitting device of claim 12, wherein the electroluminescent structure is configured to emit a blue light.

15. The light-emitting device of claim 1, further comprising a packaging layer located on the top electrode.

16. A light-emitting device, comprising:
   a substrate;
   an active device located on the substrate;
   a first light-shielding layer located on the active device and having a first opening, wherein a depth of the first opening is about 4 microns to 10 microns;
   a transparent electrode located on the first light-shielding layer and electrically connected to the active device;
   a second light-shielding layer located on the transparent electrode and having a second opening corresponding to the first opening, wherein a depth of the second opening is about 0.5 microns to 2 microns, and a relationship between a width W11 of the first opening facing the transparent electrode and a width W21 of the second opening facing the transparent electrode is $80\% \leq W21/W11 \leq 130\%$;
   a light-converting layer substantially located in the first opening;
   an electroluminescent structure substantially located in the second opening, wherein the transparent electrode is located between the first opening and the second opening and is in contact with the light-converting layer and the electroluminescent structure; and
   a top electrode, wherein the electroluminescent structure is located between the top electrode and the transparent electrode.

17. The light-emitting device of claim 16, wherein a width W12 of the first opening facing the substrate is less than the width W11, and a width W22 of the second opening away from the transparent electrode is greater than the width W21.

18. A light-emitting device, comprising:
   a substrate;
   an active device located on the substrate;
   a first light-shielding layer located on the active device and having a first opening;
   a transparent electrode located on the first light-shielding layer and electrically connected to the active device;

a second light-shielding layer located on the transparent electrode and having a second opening corresponding to the first opening;

a third light-shielding layer located between the active device and the substrate and having a third opening corresponding to the first opening;

a light-converting layer substantially located in the first opening;

an electroluminescent structure substantially located in the second opening, wherein the transparent electrode is located between the first opening and the second opening; and a top electrode, wherein the electroluminescent structure is located between the top electrode and the transparent electrode, wherein a material of each of the third light-shielding layer and the top electrode comprises aluminum, and the third light-shielding layer has a thickness greater than 50 nm.

19. A light-emitting device, comprising:

a substrate;

an active device located on the substrate, wherein the active device comprises a channel layer, a gate located on the channel layer, a gate insulating layer located between the gate and the channel layer, a source and a drain respectively electrically connected to the channel layer, and an interlayer located on the gate, the gate insulating layer and the channel layer;

a first light-shielding layer located on the active device and having a first opening, wherein the first light-shielding layer comprises a first portion and a second portion connected to the first portion, wherein the first portion substantially covers the active device, the second portion penetrates through the interlayer, and the first opening penetrates through the second portion;

a transparent electrode located on the first light-shielding layer and electrically connected to the active device;

a second light-shielding layer located on the transparent electrode and having a second opening corresponding to the first opening;

a light-converting layer substantially located in the first opening;

an electroluminescent structure substantially located in the second opening, wherein the transparent electrode is located between the first opening and the second opening; and a top electrode, wherein the electroluminescent structure is located between the top electrode and the transparent electrode, wherein the gate insulating layer comprises a thick portion overlapped with the gate and a thin portion overlapped with the first opening and the second opening, wherein a thickness of the thin portion is about 0% to 50% of the thick portion.

* * * * *